United States Patent [19]

Berger et al.

[11] Patent Number: 4,952,788
[45] Date of Patent: Aug. 28, 1990

[54] METHOD OF PHOTOELECTRIC DETECTION WITH REDUCTION OF REMANENCE OF A PHOTOTRANSISTOR, NOTABLY OF THE NIPIN TYPE

[75] Inventors: Jean L. Berger; Marc Arques, both of Grenoble, France

[73] Assignee: Thomson-CSF, Puteaux, France

[21] Appl. No.: 418,186

[22] Filed: Oct. 6, 1989

[30] Foreign Application Priority Data

Oct. 14, 1988 [FR] France .................. 88 13540

[51] Int. Cl.⁵ ............................ H04N 5/214
[52] U.S. Cl. .................. 250/208.1; 358/213.26
[58] Field of Search ............ 250/208.1, 578.1; 357/30 H, 24 LR; 358/213.15, 213.16, 213.26, 213.29

[56] References Cited

U.S. PATENT DOCUMENTS 4,617,595 10/1986 Berger ....................... 358/213.26
4,684,993 8/1987 Berger et al. ............... 358/213.29
4,744,057 5/1988 Descure et al. ............. 358/213.29

Primary Examiner—David C. Nelms
Assistant Examiner—George C. Beck
Attorney, Agent, or Firm—Roland Plottel

[57] ABSTRACT

The disclosure concerns photosensitive matrices, and especially those using NIPIN or PINIP type phototransistors made of amorphous silicon. To prevent problems of remanence, due to the collecting of holes in the base after an illumination stage, it is proposed to follow the step for reading the illumination signal by a remanence erasure step in which the phototransistor is made conductive in forward or reverse bias, so as to inject, into the base, electrons which will eliminate the holes by recombination. Switching on by reverse bias proves to be more efficient than switiching on by forward bias. The invention is applicable notably to a matrix structure of rows and columns of photosensitive sites in which each site is formed by a NIPIN transistor made of amorphous silicon in series with a reading diode that may be put into reverse conduction.

11 Claims, 4 Drawing Sheets

METHOD OF PHOTOELECTRIC DETECTION WITH REDUCTION OF REMANENCE OF A PHOTOTRANSISTOR, NOTABLY OF THE NIPIN TYPE

BACKGROUND OF THE INVENTION

1. Field of the Invention

The invention concerns photosensors and, in particular, those made in the form of a superimposition of amorphous silicon layers.

2. Description of the Prior Art

The most standard amorphous silicon photosensor is a PIN type diode formed by the superimposition of three semiconducting layers, one doped with a P type impurity, the next one non-doped (intrinsic or almost intrinsic), and the third one with N type doping.

For some years now, so-called NIPIN type, open-base phototransistors have also been proposed. These phototransistors are made by the superimposition of five layers of amorphous silicon. They have high sensitivity to light.

Such phototransistors have been described, for example, in the article "Amorphous Silicon Phototransistor on Glass Substrate" in the journal IEEE El. Dev. Lett. Vol EDL-8 No. 2, February 1987.

These phototransistors are well suited to the making of imaging matrices, capable of X and Y addressing, on large-area substrates.

But they have the drawback of having a remanent current after illumination, which is all the higher as their gain is greater. This means that a current is generated in the phototransistor during its illumination, and that it persists for a fairly long time after the illumination has stopped.

An aim of the invention is to propose a method of photoelectric detection enabling a reduction of this remanence.

FIG. 1 recalls the general structure of a NIPIN type phototransistor made of amorphous silicon. This structure is a stack of semiconductor layers made of amorphous silicon on a substrate 10 which is generally made of glass.

More precisely, the following are found, in the stated order, on the substrate:

a lower conductive layer 12 forming an emitter electrode of the phototransistor;

an intrinsic semiconducting thin layer 16;

a P type semiconducting thin layer 18, called a base layer;

a intrinsic semiconducting layer 20 which is far thicker than the first intrinsic layer 16;

an N type semiconducting thin layer 22 forming a collector region;

and a conducting layer 24, forming a collector electrode.

At least one of the electrodes, for example the collector electrode 24, is transparent or semi-transparent on the illumination source side of the phototransistor.

The base layer is not connected to an electrode. The phototransistor is an "overhead base" transistor.

With respect to the substrate, the order of the layers may be inverted, the collector being on the substrate side, and the other layers stacked on the collector (the collector region is the one located on that side where the thickest intrinsic layer is).

It is also possible to invert all the types of conductivity to make a PINIP transistor, the biases of the service voltages being then all inverted for the charge carriers are then holes (whereas they are electrons in the case of the NIPIN transistors).

FIGS. 2a to 2c represent the potential energy levels inside the semiconductor, showing the different potential barriers which get created and which get deformed in different conditions of operation. In these figures, the emitter is to the left, and the collector is to the right.

In FIG. 2a, the energy levels are represented in the case where a null potential difference $V_{ec}=0$ is applied between the collector and the emitter of the transistor. The energy levels are identical in the emitter and the collector. There is a potential barrier in the middle: the energy increases in the least thick intrinsic region (16), gets stabilized in the P type base layer (18) and falls back in the thickest intrinsic region (20). The height of the potential barrier is designated by $Vb0$.

FIG. 2b represents the deformations of the energy levels when the phototransistor is biased with a view to being used as a photodetector.

The bias is a negative voltage $V_{ec}$ of the emitter with respect to the collector.

The potential barrier between the emitter and the base is lowered to a value $Vb1$ smaller than $Vb0$.

However, the lowering is not enough to obtain a notable injection of electrons of the emitter in the base.

But if the phototransistor, and notably the intrinsic zone on the collector side, is illuminated, electron-hole pairs are generated in this zone. The electrons are drawn to the collector side, and the holes to the base side, as a consequence of the electrical field prevailing in the intrinsic zone.

Holes collect in the base which is not connected to an external source. This accumulation is restricted only by the recombination of the holes and by the diffusion of the holes towards the emitter. This accumulation further lowers the emitter-base potential barrier to a value $Vb2$ for which the base-emitter junction is slightly forward biased. FIG. 2c represents this situation.

The transistor is then switched on, and a flux of electrons is injected from the emitter towards the base. This flux is greater than the flux of electrons generated by the light: it is the phototransistor effect.

When the illumination ceases, the holes stored in the base are not instantaneously removed. They are gradually discharged by getting "untrapped" and by diffusion towards the emitter or recombination. But, so long as their quantity remains sufficient, a current of electrons injected by the emitter persists and is collected by the collector.

This current constitutes a stray remanence effect. Experience shows that it is necessary to wait for several tens of milliseconds before it disappears to a proportion of 90 to 95%. Periods approaching even one second are needed for the dark current to recover its minimal value.

This phenomenon of remanence is far greater and, therefore, more troublesome than with a simple PIN photodiode in which the remanance is due only to the storage of carriers in the traps of the intrinsic zone. With the phototransistor, there is this storage in the traps of the intrinsic zone and, furthermore, there is the current that continues to be injected from the emitter to the base.

The solution in the case of the photodiodes, which can be transposed to the case of phototransistors, is to permanently illuminate the phototransistor with an ancillary source of continuous illumination that is superimposed on the illumination which it is desired to measure.

This constant illumination generates electron-hole pairs that fill the traps, and notably the traps with the deepest energy levels. These latter traps are, in effect, the longest to empty and it is these that increase the remanence effect.

When the useful illumination (signal illumination) ceases, the ancillary illumination is maintained, and the only holes that have to disappear are those that have been collected by the illumination of the signal. These holes disappear quickly. The others remain, but they do not need to be removed because the state of equilibrium, when there is no signal illumination, takes their presence into account. They exist both when there is illumination and when there is none, and it is enough to know this to determine the useful illumination signal by difference.

The drawback of this method is the existence of a permanent photocurrent due to the constant ancillary illumination. This current is a generator of noise. Furthermore, it is not necessarily identical from one phototransistor to another in one and the same matrix of phototransistors. Finally, it calls for the presence of an ancillary light source, which is not always easy to implement.

SUMMARY OF THE INVENTION

An aim of the present invention is to propose a new method of photoelectric detection wherein the remanence is reduced, especially in the case where a NIPIN or PINIP type amorphous silicon phototransistor is used as a phototransistor.

The method can be applied to the case where the photodiode is connected between a first electrode (row electrode, for example, in the case of a matrix arrangement) and a floating node, with a switch-over element connected between the floating node and a second electrode (column electrode). In this case, the method includes a detection step in which the phototransistor is biased in non-conductive mode and the switch-over element is off. During this step, charges coming from the leakage current of the phototransistor are stored at the floating node. This leakage current is all the greater as the illumination is more intense. Then, there is a reading step during which, with the phototransistor being still in the non-conductive mode, the switch-over element is made conductive to remove the charges stored at the floating node. The method is characterized in that, after this reading step, a step is executed for the erasure of remanence. This step consists in turning the phototransistor on.

A flux of electrons is then injected into the base and flows between the emitter and the collector (in either direction as shall be seen). This flux goes through the base and gets recombined with the holes stored therein. It also crosses the intrinsic zones and also achieves a recombination of the holes trapped therein.

In a first mode of implementation, the method consists in the forward biasing of the collector-base junction of the phototransistor by application of a slightly positive voltage (about 1 to 2 volts) between the emitter and the collector (the emitter being more positive than the collector for the NIPIN transistor, and the contrary being the case for a PINIP transistor).

In another mode of implementation which has the unexpected advantage of reducing the dark current of the phototransistor, the method consists in reverse biasing the collector-base junction, to an extent that is sufficient to go beyond a reverse conduction or switch-on threshold of the phototransistor and to then let through a not inconsiderable current capable, by recombination, of removing the holes stored in the base. The voltage applied between the emitter and the collector is then relatively high (several volts) and is positive on the collector side (for a NIPIN transistor).

This voltage is preferably quite close to the flexion point of the current-voltage characteristic (in reverse bias) of the phototransistor.

The method according to the invention is quite applicable to non-connected base phototransistors, the emitter-base and collector-base junctions being made conductive by a voltage between the collector and the emitter.

The switch-over element, which is off during the integration of the photocharges and conductive during the reading of these charges, is in principle a reading diode with a far lower capacitance than that of the phototransistor. Preferably, this diode may be switched on in reverse mode and this property will be used to perform an erasure of the remanence.

In an advantageous embodiment, the reading diode has a first conduction threshold in the forward direction and a second conduction threshold in the opposite direction, the NIPIN phototransistor also has a first conduction or switch-on threshold in the forward direction and a conduction or switch-on threshold in the reverse direction. The phototransistor and the reading diode are in series with the same direction of forward conduction, and the matrix works by application of a cycle of signals on the row conductors in the following manner:

first of all, an idle voltage level is applied to the row conductor during a stage of integration of charges due to the illumination;

then a voltage pulse, called a reading pulse, is applied, said reading pulse having a first sign with respect to the idle level;

then a voltage pulse of the opposite sign is applied, this voltage pulse being called a remanence erasure pulse, the potential difference between the level of this pulse and the potential of the column conductor being greater in terms of absolute value than the sum of the reverse conduction thresholds of the phototransistor and of the reading diode.

Preferably, this difference is fairly close to the sum of the reverse conduction thresholds.

In this way, during the remanence erasure pulse, not only the reading diode but also, shortly afterwards, the phototransistor itself, are made conductive. Electrons are injected into the base and get recombined with the holes which cause the remanence of the current in the phototransistor.

Preferably, a resetting pulse, with a sign opposite to the remanence erasure pulse, follows this latter pulse, and its amplitude is such that it enables the reading diode to be again made to become conductive in forward mode. Finally, the resetting pulse ends with the return of the row voltage to its idle value.

The reading diode may itself be formed by a five-layered structure of the NIPIN or PINIP type.

In the prior art, we may note the U.S. Pat. No. 4.737.832 which describes a phototransistor detection system. After a reading step, there is a step for the removal of the charges stored in the base of the transistor. However, this is because, firstly, the photoelectric charges generated by the illumination are stored in the base (and not, as in the invention, at a floating node connected to the collector) and because, secondly, the reading step does not consist in the removal of these charges. The reading is non-destructive. It is therefore necessary to reinitialize the phototransistor before a new illumination stage. In the invention, the charges are stored at the collector. The reading step removes these charges, but it is observed that the base gets charged partially, sufficiently to leave a persisting remanence effect which it is desired to eliminate.

BRIEF DESCRIPTION OF THE DRAWINGS

Other features and advantages of the invention of the invention will appear from the following detailed description, made with reference to the appended drawings of which.

DESCRIPTION OF PREFERRED EMBODIMENTS

Figure 1:
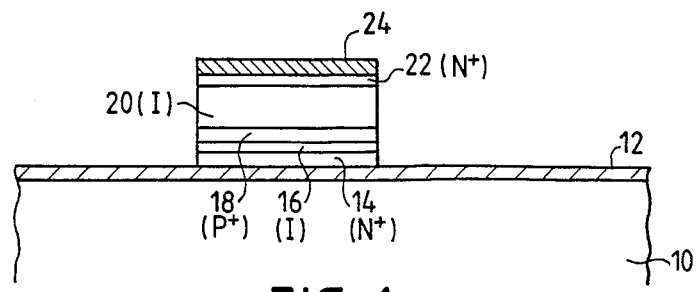
FIG. 1, already described, represents the general structure of a NIPIN phototransistor.
Figure 2A:
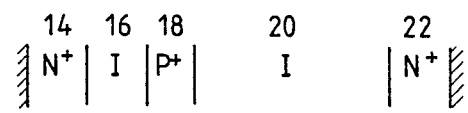
FIG. 2 (2a, 2b, 2c), also already described, represents the energy levels of the carriers within different semiconducting layers in different circumstances.
Figure 2A:
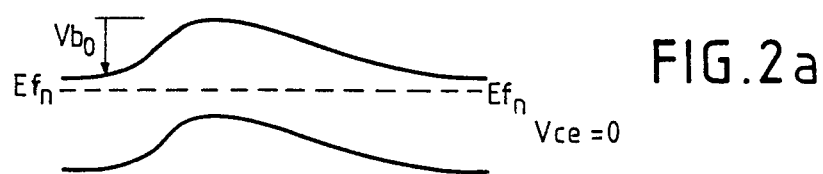
Figure 2B:
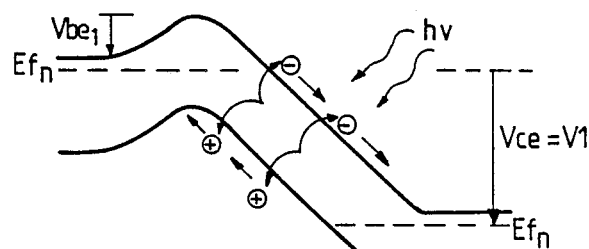
Figure 2C:
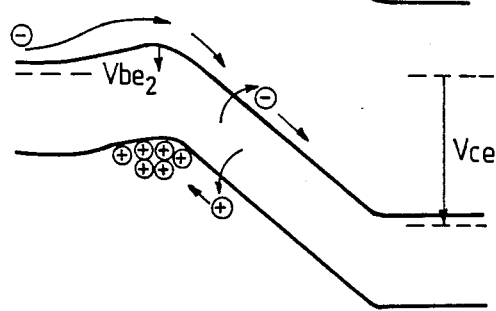
Figure 3:
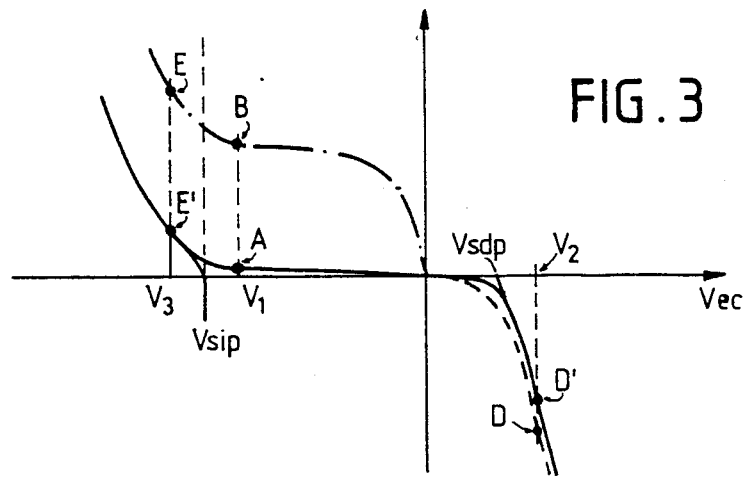
FIG. 3 represents the current-voltage characteristics of the phototransistor when there is illumination and when there is no illumination.

The general current/voltage characteristic curve of a phototransistor is shown in FIG. 3.

The x-axis shows the emitter-collector voltage Vec (positive sign on the emitter side for a NIPIN transistor). On the y-axis, there is the current Ice going through the phototransistor between the emitter and the collector.

The characteristic curve drawn in a solid line is the characteristic curve in darkness. It has a positive forward conduction threshold Vsdp and a negative reverse conduction threshold Vsip. Between the threshold Vsdp and the threshold Vsip, the current flowing through the transistor is a weak current called a "dark current". Beyond the thresholds, the phototransistor becomes conductive, and lets through a strong current.

The characteristic curve drawn in dashes represents the current in the presence of an illumination. The current for a given voltage Vec is all the higher as the illumination is greater, even between the thresholds Vsdp and Vsip. The bias voltage chosen in normal operation is a reverse bias voltage Vec=V1, V1 being, in terms of absolute value, slightly below the threshold Vsip. The term "reverse bias" implies the fact that the collector-base junction of the phototransistor is in reverse (with the collector being more positive than the emitter for a NIPIN transistor).

During operation, the transistor is biased at the outset in darkness at the point A of the characteristic curve drawn in a solid line. Then, the phototransistor is illuminated, and the bias point gets shifted to B. This current is, for example, integrated into a capacitor and then read in a reading amplifier.

Once the signal has been read, according to the invention, the remanence is eliminated by applying an erasing voltage pulse Veff making the phototransistor conductive.

In a first approach, a voltage V2 is set up at the terminals of the phototransistor. This voltage V2 has a forward bias Veff=V2 which is greater, in terms of absolute value, than the forward conduction threshold Vsdp. The bias point shifts to the point D of the characteristic curve. A current flows from the emitter towards the collector, and goes through the base.

An accelerated recombination of holes takes place in the base, getting rid of the remanence.

Then, the bias point returns towards the dark characteristic (point D'). Finally, the bias voltage V1 is again applied to return to the point A.

This cycle, described in assuming that the illumination is interrupted between two successive signal readings, would be similar if the illumination were to be continuous, but there would be a direct passage from the point D to the point B without going through the point A.

In practice, it is seen that that this method really reduces the remanence to an appreciable extent, but it is unfortunately accompanied by a notable increase in the dark current when the bias V1 is returned to.

This current is only transient and independent of the preceding illumination, but it introduces carriers that get added to those of the following signal. We therefore have a relatively strong, continuous signal background superimposed on the useful signal, which is a noise generator, somewhat like the standard method in which it is sought to remove the remanence by adding on a continuous illumination superimposed on the signal.

This transient current, after the conduction of the phototransistor, may be interpreted as a de-saturation of the traps of the intrinsic zone between the base and the collector. These traps are, in effect, filled with electrons during the application of the erasing voltage Veff=V2. Besides, it can be experimentally verified that this dark current, following the application of the voltage V2, is all the greater as the amplitude of the voltage V2 is high, once this amplitude effectively, in terms of absolute value, exceeds the amplitude of the forward conduction threshold voltage Vsdp of the phototransistor.

As an alternative embodiment, which is more worthwhile as regards the dark current, the invention proposes a reading cycle in which the remanence is removed by the application, between the collector and the emitter of the phototransistor, of an erasing voltage Veff=V3 which is not in forward mode like the voltage V2 but in reverse mode, and has a greater amplitude, in terms of absolute value, than the reverse conduction threshold voltage (Vsip) of the phototransistor.

There is a lowering of the emitter-base potential barrier and an injection of electrons from the emitter to the base (and no longer from the collector towards the base). In going through the base, the electrons get recombined with the holes that have collected there, thus removing the remanence.

In this case, the reading and remanence erasure cycle makes the point of bias of the phototransistor on FIG. 3 go from the point A (darkness) to the point B (illumination) then to the point E (application of the remanence erasing voltage Veff=V3), then to the point E' (elimination of illumination) and finally to the point A (return to normal bias V1). As earlier, the return can be done directly from the point E to the point B without going through the point E' and the point A if the illumination is continuous and uninterrupted between two successive readings.

When the erasure is done, in this way, by the application of a reverse voltage greater than the conduction threshold of the phototransistor, it is noted that, at least for the values of the voltage V3 that are not excessively high, the dark current gets reduced with the amplitude of V3. Whence the improvement over the example of erasure by the application of a voltage V2 for the forward switching-on of the phototransistor.

To obtain this result, the flow of electrons should not be too great during the erasure pulse. The erasing voltage Veff=V3 should therefore be relatively close to the flexion point of the characteristic Ice=f(Vec) of the phototransistor, i.e. close to the threshold Vsip.

FIG. 4 represents a graph of the variations of the amplitude of the transient dark current after erasure of the remanence (graph 4a) and of the variations of the graphic remanence (graph 4b) as a function of the amplitude of the erasing voltage Veff applied (V2 on the forward voltages side, V3 on the reverse voltages side).

Figure 4A:
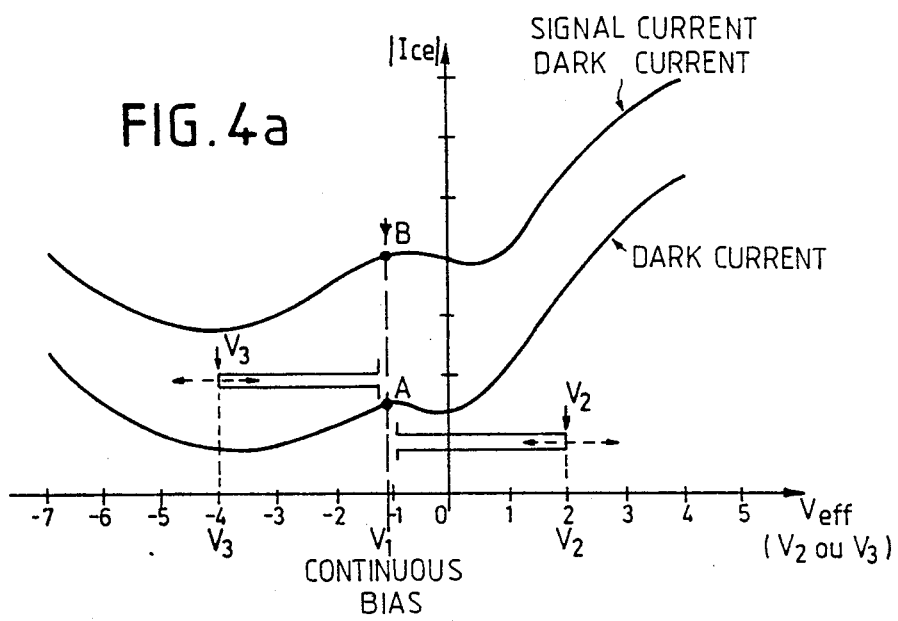
FIG. 4 represents the variations of the dark current (in terms of absolute value) and of the remanence as a function of the amplitude of the remanence erasure pulse that is applied, according to the invention, to the phototransistor.

In FIG. 4a, the points on the x-axis represent the value of the erasing voltage. The points on the y-axis represent the current Ice (in darkness, or in the presence of signal illumination) immediately after erasure.

Figure 4B:
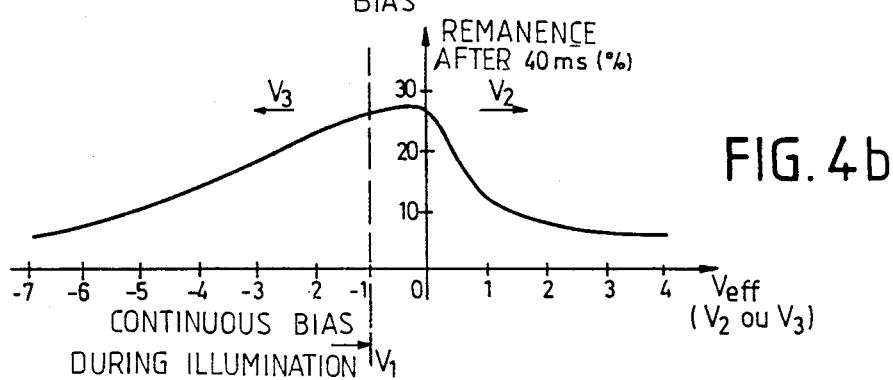

In FIG. 4b the points on the x-axis again represent the value of the erasing voltage. The points on the y-axis represent, in terms of percentage of the useful signal, the remanence that persists at the end of a determined time chosen, for example, as being equal to 40 milliseconds after the application of the erasing voltage.

In these graphs, it is seen:

first of all, that the situation is, on the whole, more favorable on the reverse erasing voltages (V3) side since it is possible to have both a fairly low remanence and a fairly low dark transient current, secondly, that there is an optimal region which is located, in the example shown, between the graduations 4 and 6 approximately (on the x-axis) where both a minimal dark current and a low remanence are obtained.

It is thus sought to apply an erasing voltage in this region, which corresponds in practice to an erasing voltage Veff close to the reverse conduction threshold Vsip of the phototransistor.

This remanence erasure method according to the invention can be applied to the case of a matrix of photosensitive dots, each formed by a phototransistor in series with a reading diode. A matrix such as this is described in the French patent application No. 88 02360 dated 26th Feb. 1988.

Figure 5:
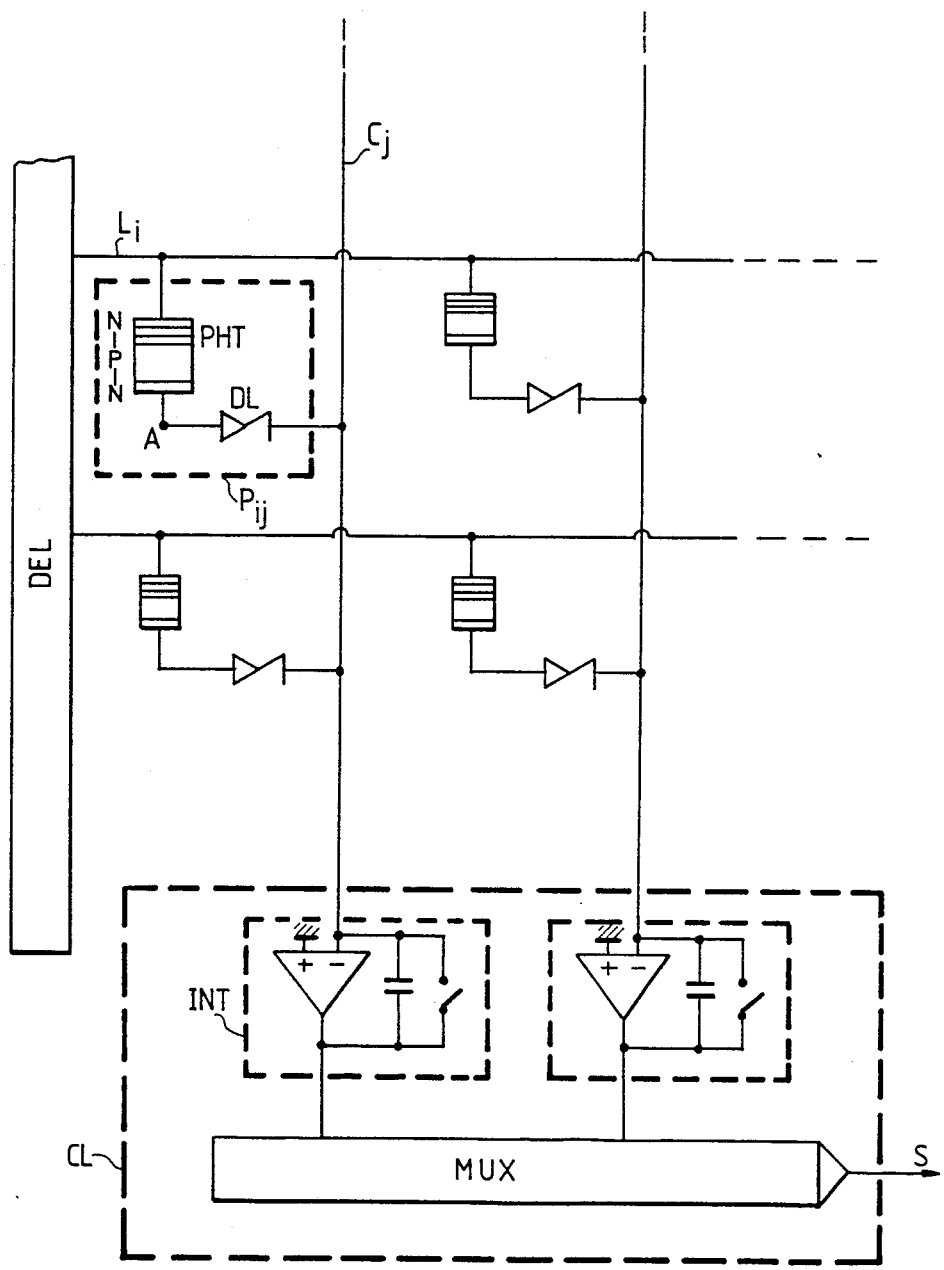
FIG. 5 represents a matrix of photosensitive dots enabling the implementation of the invention.

We shall now describe the practical implementation of the invention with respect to a structure of this kind, shown in FIG. 5.

The matrix has a network of rows and columns of photosensitive dots Pij.

Each row has a row conductor Li to which the photosensitive dots of this row are connected. The row conductor Li is used to give an idle voltage Vpo during an integration stage, then a reading pulse during a reading stage, and a resetting pulse during a resetting stage before a new integration stage. The row conductors are connected to a row decoder DEL capable of selecting a determined row, the dots of which it is desired to read, and of giving the reading and resetting pulses on this selected row while the other rows are kept at the idle voltage Vpo.

Each column has a column conductor Cj to which the photosensitive dots of this column are connected. The column conductor Cj is connected to a circuit CL for reading the charges generated by the photosensitive dot Pij located at the intersection of this column with the selected row.

In one embodiment, the reading circuit includes an integrator INT for each of the columns of dots and a multiplexer MUX receiving the outputs of the integrators to give successively, at its output S, signals representing the illumination of the successive dots of the designated row.

In other cases, the reading circuit may be a charge transfer circuit, and the multiplexer may be a charge transfer shift register.

Each photosensitive dot Pij includes a NIPIN phototransistor represented by a five-layered structure designated by the reference PHT. This element is series connected with a switch-over element which is a reading diode DL in this case, and the set is connected between a row Li and a column Cj.

The junction point A between the phototransistor and the reading diode is the node at which the electrical charges generated by the illumination collect.

The reading diode DL, which enables the transfer of charges from the floating node A towards the column conductor Cj, should have a small capacitance as compared with that of the phototransistor. This enables the total capacitance, as seen from the column, to be appreciably smaller than the sum of the capacitances of the phototransistors connected to this column.

Besides, the reading diode may be put into forward conduction if the voltage at its terminals becomes greater than a first voltage threshold Vsd in the forward direction, and it can be put into reverse conduction if the voltage at its terminals becomes greater than a second voltage threshold Vsi in the reverse direction.

In other words, the reading diode has a current/voltage characteristic curve that is analogous to that of a zener diode. The collector of the phototransistor and the anode of the reading diode are connected to the floating node A. The two elements are therefore series connected with the same direction of conduction (in FIG. 5: forward direction of conduction from the row conductor to the column conductor, for the column conductor as well as for the diode).

The voltage thresholds should be compatible with the working of the control circuits of the matrix. If the matrix has to work with MOS transistors for example, it is desirable that the conduction thresholds should not be equal to more than 12 to 15 volts in terms of absolute value.

But, on the other hand, the difference between the first and second thresholds should be great enough, for it is this threshold that will limit the dynamic range of the illumination measuring signal.

By way of example, it is possible to make diodes which go into forward conduction for a first positive threshold of about +1 volt, and which go into reverse conduction for a second negative voltage threshold which is adjustable between about −8 to −15 volts, by an appropriate choice of dopings of semiconducting layers.

Since it is extremely desirable for these thresholds to be stable and reproducible, it will be chosen to make the reading diode DL according to a technology that enables this stability and this reproducibility to be obtained. It has been observed that a diode, for which the reverse conduction is achieved by the avalanching of a junction, does not give all the requisite guarantees of stability and reproducibility. But an open-base NIPIN type transistor, the reverse conduction of which takes place by a lowering of a potential barrier, may act as a reading diode having far more efficient characteristics from this point of view. Consequently, the reading diode itself could very well be designed to be a NIPIN transistor (preferably not illuminated and far smaller than the phototransistor). That side of this transistor which is connected to the column conductor is the collector (on the thickest intrinsic layer side) if the phototransistor PHT itself has its collector connected to the point A. If not, it is the other side.

We shall now describe the working of the matrix of FIG. 5.

To simplify the explanation, it shall be assumed that the capacitance of the reading diode is negligible as compared with that of the phototransistor. If this were not the case, the digital values of the potentials and potential variations indicated during the explanations would be modified, but the principle of operation would remain valid.

It shall also be assumed that the reading circuit connected to the columns keeps their potential at a null reference value.

Figure 6:
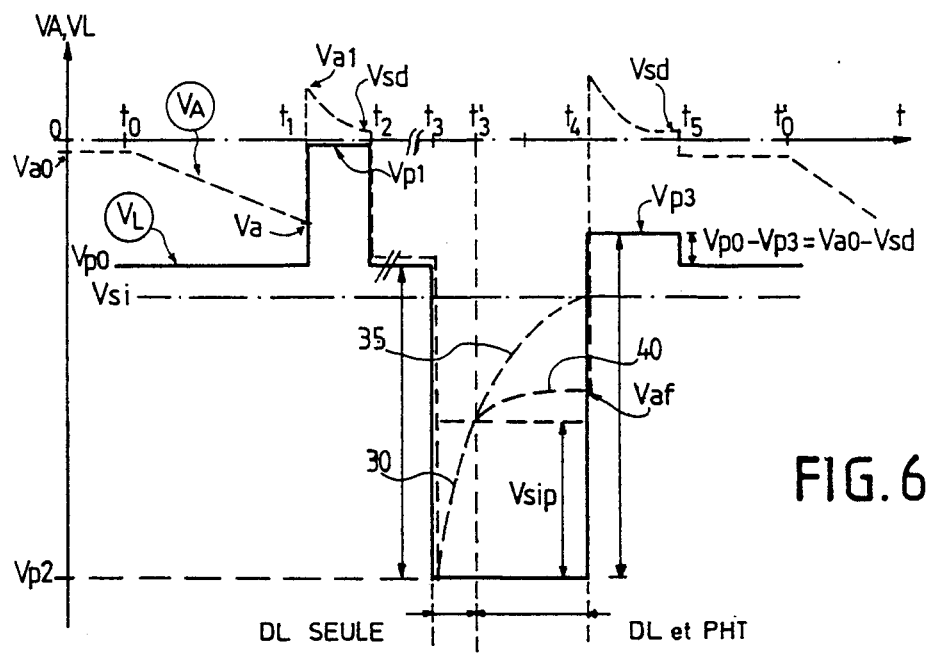
FIG. 6 represents the timing diagrams of potentials of a row conductor and of the point of storage of charges of a photosensitive dot of FIG. 5.

FIG. 6 represents timing diagrams enabling the operation to be illustrated. The variations in the potential VL applied to the row conductor Li are shown in solid lines. The variations in the potential VA of the node A are shown in dashes.

The periodic working cycle lasts between an instant t0 and and instant t'o.

At the outset, just after the instant t0, that is, just after the potential of the row conductor of a selected row has been brought back to its idle voltage Vpo, the initial state is as follows:

the potential VL on the row conductor Li has an idle value Vpo, for example −5 volts. The value is chosen in such a way that the phototransistor is reverse biased even when the potential of the node A falls subsequent to the arrival of photocharges.

the potential VA on the node has a value VaO which is null or close to zero, at any rate such that the reading diode is not put into forward conduction.

the potential of the conductor Cj is a reference potential, hypothetically assumed to be equal to zero.

It will be seen that it is actually the situation existing at the end of the cycle that shall now be described.

At the instant t0, there starts a charge integration stage which will last until the instant t1. It will be noted that this stage may start at the same time as the preceding stage ends, or at the instant when a signal illumination is applied (should the illumination be not continuous). It will be also noted that the charge integration stage ends either when the illumination ceases (non-continuous illumination) or at the start of the reading stage that follows the illumination stage. In the example shown, it has been chosen to consider the illumination as being continuous. The collection of charges at the node A will therefore last until the instant t1, when a reading pulse will be applied.

The illumination generates charges that collect at the node A under the influence of the electrical field in the phototransistor PHT. With the chosen potential directions, in view of the connection direction of the photodiode, the charges that collect are electrons.

The potential of the node A falls as and when the charges arrive, hence with a declining slope that is proportionate to the intensity of the illumination.

At the instant t1, the period of integration ends and a reading pulse is applied to the selected row conductor, making its potential go from an idle value Vpo to a value Vp1.

The value Vp1 is chosen so that it does not put the phototransistor into forward conduction but is close enough to zero for the dynamic range of illumination measurement to be high enough. This dynamic range is, in effect, related to the potential difference between Vp1 and Vpo, and this difference should be sufficient. In practice, Vp1 is practically equal to zero and, in any case, smaller than the forward conduction threshold Vsdp of the phototransistor.

By capacitive coupling, the sudden increase in voltage at the row conductor is transmitted to the node A. The photoconductor is reverse biased, and since its capacitance is far higher than that of the reading diode, the essential part of the amplitude of the rising edge of the reading pulse is recovered at the node A.

The potential of the node A, which had a value Va that was all the smaller as the illumination had been higher during the integration stage, suddenly increases by a value (Vp1−Vpo). It assumes a value Va1=−Va+Vp1−Vpo.

The potential of the node A was below zero, and goes above zero at the instant t1. The reading diode becomes conductive and a quantity of charges is removed towards the column conductor. This quantity represents a measurement of the illumination to which the photodiode is subjected from t0 to t1. It is detected and exploited by the reading circuit CL.

The quantity of charges thus transferred to the column is all the weaker as the illumination is greater. This may be advantageous for the reading of the low illuminations.

The reading pulse lasts long enough for the totality of the charges present at the node A to have the time to be removed. It ends at the instant t2. The potential of the node A is then substantially equal to the forward conduction voltage Vsd of the reading diode, and the reading diode may then be considered to have returned to the off state.

The end of the reading pulse is a return to Vp0 of the potential VL of the row conductor. This return is expressed, by capacitive coupling through the phototransistor, by a sudden fall in the potential of the node A which goes from about Vsd to Vsd−Vp1+Vp0.

At the instant t3, the remanence erasure pulse is applied. The time interval t2, t3 between the end of the reading pulse and the start of the remanence erasure pulse could be reduced to zero. However, it is also possible to preserve a time interval t2/t3 during which reading pulses will be applied to the other rows of the matrix. The potential VL of the row conductor returns temporarily to its idle value Vp0 during this interval.

The remanence erasure pulse consists in making the potential VL of the row conductor go to a value Vp2 such that the potential of the node A falls, by capacitive coupling, to a value which is low enough for not only the reading diode but also the phototransistor to go into reverse conduction.

Here again, since the phototransistor has a far greater capacitance than the capacitance of the reading diode, the variation in potential Vp2-Vp0 is retransmitted practically integrally to the node A.

Figure 7:
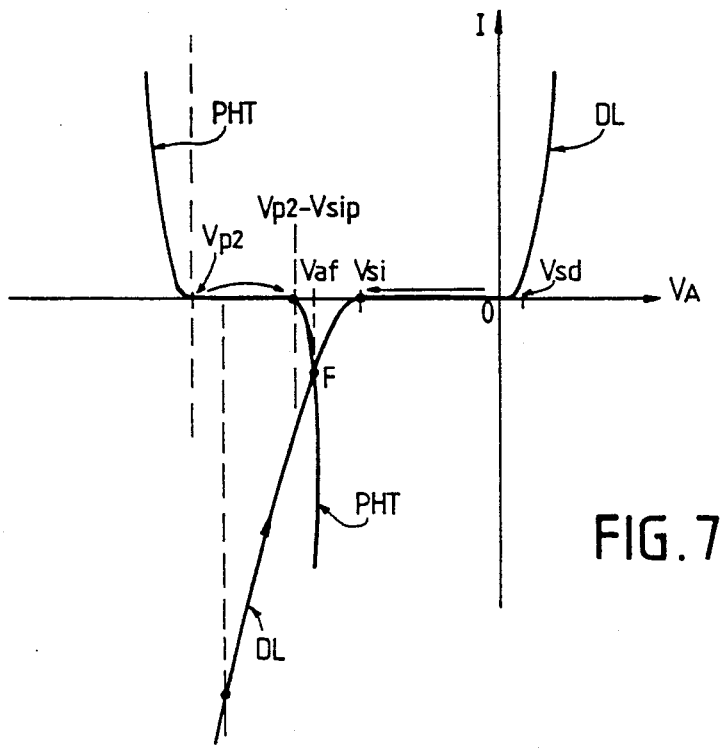
FIG. 7 represents the current-voltage characteristics of the phototransistor and of the reading diode at the time of the remanence erasure operation according to the invention.

To give a detailed explanation of the variations in potential during this step of erasure of the remanence of the phototransistor, reference shall be made both to FIG. 6 (the timing diagram of the potentials of the row conductor and of the node A) and to FIG. 7 which represents, at a particular instant of the erasure of remanence, between the instants t3 and t4, the potentials and currents in the reading diode and phototransistor.

At the instant t3, the potential of the node A goes to the value Vsd−Vp1+Vp0+Vp2−Vp0, namely to Vsd+Vp2−Vp1.

This value is highly negative, and is higher, in terms of absolute value, than the reverse mode conduction threshold Vsi of the reading diode. The diode becomes conductive and tends to bring about a voltage drop equal to about Vsi at its terminals. As the column potential is now set at zero, it is the potential of the node A that rises from the value Vsd+Vp2−Vp1 up to the value Vsi (see the portion of curve in dashes 30 in FIG. 6).

During this time, the potential of the conductor stays at Vp2. The difference in voltage between the potential of the node A and the potential of the row conductor thus increases very quickly. At the instant t'3, it is seen that this difference reaches the value Vsip which is the reverse conduction threshold of the phototransistor, while the reading diode is still, to a large extent, in reverse conduction.

If we refer to FIG. 6, this is possible, provided that the potential Vp2 of the remanence erasure pulse has been chosen to be greater in terms of absolute value than the sum of the reverse conduction thresholds of the transistor and of the diode (Vsi+Vsip).

The phototransistor then becomes conductive in reverse conduction and tends to maintain, between its terminals, a voltage Vsip, or a voltage that is slightly greater, in terms of absolute value, than Vsip. Consequently, instead of continuing to tend towards the value Vsi (curve in dashes 35 which it would follow if the phototransistor were not to become conductive), the potential of the node gets stabilized at a value that is slightly smaller, in terms of absolute value, than Vp2-Vsip (portion of curve 40 in FIG. 6).

During the stage corresponding to the curve 40, both the diode and the phototransistor are in reverse conduction. As these elements are in series, they tend to have one and the same current flow through them. This is why the current-voltage characteristic curves of these two elements have been shown in FIG. 7, the reference potential being:

for the diode, the null potential of the conductor to which it is connected;

and for the phototransistor, the potential Vp2 of the row conductor to which it is connected.

More precisely, FIG. 7 represents the current flowing through the phototransistor and the reading diode as a function of the potential of the node A, between the instants t'3 and t4.

The characteristic curves intersect at a point of operation F for which the currents in the diode and in the phototransistor are identical.

The potential of the node A then remains substantially at this operating point F until the end of the remanence erasure pulse. As can be easily seen in FIG. 6 and in FIG. 7, the potential Vaf of this operating point is between Vsi and Vp2−Vsi.

According to a major characteristic of the invention, it is seen to it that the potential Vaf of this operating point is close enough to Vp2−Vsip, in choosing the potential Vp2 to be fairly close to Vsi+Vsip.

The switching-on of the phototransistor from the instant t'3 onwards and up to the instant t4 (end of the erasure pulse) has the effect of making a current of electrons flow in its base and, hence, of removing, by recombination, the holes that are a source of remanence. The choice, for the potential Vp2, of a value close to Vsi+Vsip enables the minimizing of the transient dark current that follows the erasure of the remanence. It is obviously necessary for the time interval t'3/yt4 (and consequently t3/t4) to be long enough for the carriers stored in the base to have the time to get recombined.

The cycle continues preferably by the application, at the instant t4, of a resetting pulse with a sign opposite to the erasure pulse, and with an amplitude that is enough to make the potential of the node A rise above zero. This enables the reading diode to be made conductive, this time in forward mode, and to consequently bring back the potential of the node A to a value of the order of Vsd.

Finally, the resetting pulse ends at the instant t5 by a return of the row potential VL to its initial idle value Vp0. During this return, the node A must then also return, by capacitive coupling, to its initial value Va0. This means that the amplitude of the final potential leap for the return of VL towards Vp0 should be equal to Va0−Vsd. This also means that the voltage level Vp3 of the resetting pulse is such that Vp0−Vp3=Va0−Vsd.

For the reading diode to return effectively to forward conduction during the resetting pulse, it is also necessary for the voltage leap Vp3−Vp2 to take the potential of the node A above the threshold Vsd, by capacitive coupling. Now the potential of the node A at the end of the remanence erasure pulse is Vaf (between Vsi and Vp2−Vsip).

It is therefore necessary for Vp3−Vp2 to be greater than Vsd−Vaf.

These different constraints enable an accurate choice to be made of the different values of the potentials of the row conductor to arrive at the result sought. The potential Vp2 will be adjusted so as to optimize the position of the point F (FIG. 7), namely of the potential Vaf, to arrive at the best possible compromise between the erasure of the remanence and the reduction of the dark current after this erasure.

A new integration cycle recommences at the instant t'0 when the matrix is again illuminated. The instant t'0 may be merged with the instant t5. It is necessarily merged with t5 when the signal illumination is continuous.

In the integration/reading/remanence erasure/resetting cycle, it will be seen to it that the necessary operations of reading, erasing and resetting the photosensitive dots of the other rows of the matrix are done. It can be seen to it, for example, that the time interval between t2 (end of the reading) and t3 (erasure of remanence) is long enough to enable the application of the reading pulses successively to all the rows of the matrix. The remanence erasure and resetting pulses may then be applied simultaneously to all the rows of the matrix.

But other approaches could also be provided for, such as a reading, a remanence erasure and a resetting for one row, and then a reading, a remanence erasure and a resetting for a following row, etc.

WHAT IS CLAIMED IS:

1. A method of photoelectric detection wherein there is used, as a detection element, a phototransistor connected between a first electrode and a floating node, with a switch-over element connected between the floating node and a second electrode, the method including a detection step in which the phototransistor is biased in non-conductive mode and photoelectric charges generated in the phototransistor are stored at the floating node, and a reading step during which the switch-over element is made conductive and the stored charges are removed, a method wherein, after the reading step, a step is executed for the erasure of remanence, consisting in turning the phototransistor on.

2. A method according to claim 1, wherein the phototransistor is a non-connected base transistor, and its being made conductive during the remanence erasure step is achieved by the application of a high voltage pulse between the collector and the emitter.

3. A method according to claim 2, wherein the voltage pulse is applied in forward bias, injecting charges from the emitter to the base.

4. A method according to claim 2, wherein the voltage pulse is applied in reverse bias, injecting charges from the collector to the base, the bias being high enough to make the transistor go beyond a reverse conduction threshold.

5. A method according to claim 4, wherein the reverse bias voltage during the erasure of the remanence is close to the reverse conduction threshold voltage of the phototransistor.

6. A method according to claim 1, wherein the phototransistor is a PINIP or NIPIN phototransistor made of amorphous silicon with five superimposed layers.

7. A method for the erasure of the remanence of a photosensitive matrix, each photosensitive dot of which comprises a phototransistor as a photosensitive element and a reading diode, placed in series with the latter between a row conductor and a column conductor of the matrix, the reading diode and the phototransistor being capable of being placed in reverse conduction, wherein:
  first of all, an idle voltage level is applied to the row conductor during a stage of integration of charges due to the illumination;
  then a voltage pulse, called a reading pulse, is applied, said reading pulse having a first sign with respect to the idle level;
  then a voltage pulse of the opposite sign is applied, this voltage pulse being called a remanence erasure pulse, the potential difference between the level of this pulse and the potential of the column conductor being greater in terms of absolute value than the sum of the reverse conduction thresholds of the phototransistor and of the reading diode.

8. A method according to claim 7, wherein the potential difference between the level of the erasure pulse and the potential of the column conductor is close to the sum of the reverse conduction thresholds of the reading diode and of the phototransistor.

9. A method according to claim 7, wherein the erasure pulse is followed by a resetting pulse, with an amplitude that is sufficient to place the reading diode again under forward conduction.

10. A method according to claim 7, wherein the reading pulses are applied successively to the different rows of the matrix, and wherein the remanence erasure pulses are applied simultaneously for all the rows, a time interval being planned between the end of the reading pulse and the start of the remanence erasure pulse.

11. A method according to claim 7, 10, wherein the reading diode is made in the form of a non-connected base transistor of the NIPIN or PINIP type, placed in series and in the same direction as the phototransistor.

* * * * *